United States Patent [19]

Walter et al.

[11] Patent Number: 5,764,552

[45] Date of Patent: Jun. 9, 1998

[54] METHOD FOR ADJUSTING AN ADAPTIVE EXPONENTIAL FILTER

[75] Inventors: Hilger A. Walter; Ernst Quelle, both of Stade, Germany; Yahya Nazer, Sherwood Park, Canada

[73] Assignee: The Dow Chemical Company, Midland, Mich.

[21] Appl. No.: 501,004

[22] PCT Filed: Jan. 4, 1994

[86] PCT No.: PCT/US94/00284

§ 371 Date: Jun. 28, 1996

§ 102(e) Date: Jun. 28, 1996

[87] PCT Pub. No.: WO94/19754

PCT Pub. Date: Sep. 1, 1994

[30] Foreign Application Priority Data

Feb. 18, 1993 [EP] European Pat. Off. ............ 93102558

[51] Int. Cl.$^6$ ...................................................... G06F 17/10
[52] U.S. Cl. ............................................................ 364/724.19
[58] Field of Search ........................ 364/724.011, 724.17, 364/724.19, 724.2, 151, 162, 157

[56] References Cited

U.S. PATENT DOCUMENTS

| | | | |
|---|---|---|---|
| 4,679,136 | 7/1987 | Shigemasa | 364/150 |
| 4,719,561 | 1/1988 | Shigemasa | 364/148 |
| 5,150,317 | 9/1992 | Countryman | 364/724.011 |
| 5,237,524 | 8/1993 | Heinemann | 364/724.19 |

*Primary Examiner*—Chuong Dinh Ngo
*Attorney, Agent, or Firm*—Dale H. Schultz

[57] ABSTRACT

A method for adjusting an adaptive exponential filter, especially for noise reduction. The input of the filter is supplied with a series of time-discrete input signals containing both data and noise. An estimate of the standard deviation of the filter input signal has been determined prior to the execution of the adaptive exponential filter method. The method including: measuring the deviation between a current filter input signal to the filter and the prior sample period's output signal from the filter; determining the proportion of the deviation to the estimate of the standard deviation; and adjusting the discrete time constant of the filter in response to the proportion to provide a filter output signal at the output of the filter.

17 Claims, 3 Drawing Sheets

METHOD FOR ADJUSTING AN ADAPTIVE EXPONENTIAL FILTER

This is a 371 of PCT/US 94/00284 filed Jan 4, 1994.

BACKGROUND OF THE INVENTION

The invention relates to a method for adjusting an adaptive exponential filter and an adaptive exponential filter. The invention is useful in the reduction of the noise component in a signal representing the value of the measurement. The input of the filter is supplied with a series of time-discrete input signals containing both a data component (or the value representing the measurement) and a noise component (or a distortion of the value representing the measurement). Within a process control context, the invention further relates to the use of the adaptive exponential filter in a control loop, a control loop, and a method for controlling a control loop.

Adaptive filters are filters that have the ability to adjust their own parameters automatically. They can be used to diminish the adverse effects of noise distortion in processing signals in a number of applications such as noise cancellation or noise reduction, echo canceller, leakage compensation, line equalization, speech processing, or the like. In this connection the term "noise" is used to signify all forms of interference.

In the case of process control, noise signals can either be produced in the process system (to which measurements are applied) as process noise or in the measurement system as measurement noise. It is usually not possible to identify the source of noise in a signal through the use of conventional analytical techniques on the time discrete signals themselves. Usually, noise will demonstrate an oscillatory or vibrational characteristic when a series of discrete signals is analyzed as a function of time; usually, the overall oscillatory pattern can be resolved into a set of sine waves having characteristic frequencies.

Process noise is produced from transient variations in the process system itself in the regions Droximate to the location of the measuring sensor. There are a variety of factors that can contribute to such variations in the process system itself such as the presence of entrained gas bubbles in a liquid, local variations in a liquid density as in the case of agitated oil/water mixtures, local variations in liquid temperature, turbulence, or the like.

Measurement noise is produced in each stage of the measurement system. The measurement noise is usually a function of the quality of the measurement system.

Current methods used to measure process variables such as temperature, pressure, and flow inherently yield signals which incorporate both process noise and measurement noise in their magnitude. Hence, using a process signal corrupted by noise is a long-standing problem of process control engineers. When steady state or average values are needed by the system receiving the measurements, as in the case where an energy or mass balance is to be calculated, conventional filtering techniques will reduce the effects of the higher frequency portion of the noisy signal significantly. However, response by such filters to lower frequency process fluctuation noise will have a considerable phase lag which will continue to induce uncertainty in the representative character of the value of the signal being output from the filter.

The successful design of a filter to minimize the effects of the noisy signal is based upon the understanding of the types and nature of the noise in the measurement of chemical processes, operating equipment, machinery, or the like.

Natural phenomena, such as noise, are usually not uniformly distributed. Instead, they are more likely to follow a normal distribution also known as Gaussian Distribution which has well-known bell-shaped distribution properties. Random numbers generated by this distribution tend to cluster about the mean or average value of the entire group. As values depart from the mean, they occur less frequently.

The most commonly used filter for noise reduction in the field of process control is an exponential filter. Such exponential filters are designed to filter digital (usually time-discrete) input signals. Such input signals can be any digital signals, i.e. digital signals resulting from a process of analog to digital conversion of respective currents or voltages which have been output from transducers measuring characteristics of a chemical manufacturing process where such digital signals are then used in a process control computer which is controlling or operating said chemical manufacturing process through the generation of output signals to various valves, pumps, and motors. Such signals are corrupted by noise and contain both data of value and noise which usually tends to distort said data of value.

With $x_k$ as filter input signal (which is also the digitized discrete process output signal representing the measurement of some variable in said process at current sampling periods), $y_{k-1}$ as the delayed filter output signal from the prior sampling period, and k as the time index, the filter output signal $y_k$ for the current sampling period is defined by $$Y_k = (1-F_k) \cdot Y_{k-1} + F_k \cdot x_k \qquad (1)$$

where $F_k$ is the discrete filter time constant being defined by $$F_k = 1 - e^{-T_s/T_p} \qquad (2)$$

with the sampling period $T_s$ and the continuous filter time constant $T_p$.

It should be noted that the term "time constant" when used in this disclosure derives from the traditional art and lexicon of process control and instrument engineering. Although the traditional terminology has been utilized in this disclosure, the literal meaning of the word "constant" with its connotation of "unvarying" may, in some cases, be somewhat altered in the context of the present disclosure since the value of a "time constant" might, in some cases, be recalculated at various times and will, therefore, "vary" with time when time is viewed in an extended context. Notwithstanding, the terminology is still valid when considered by one skilled in the art because of its traditional use in referencing certain components of formulae related to process dynamics.

Conventional exponential filters are adjusted by adjusting the sampling period $T_s$ and the continuous filter time constant $T_p$ according to complicated rules, whereby the discrete filter time constant $F_k$ is adjusted according to equation (2).

SUMMARY OF THE INVENTION

One object of the invention is to provide a method for easily adjusting the optimal discrete time constant of an exponential filter in correspondence with a current time-discrete input signal supplied to the input of the filter.

Another object is to provide an adaptive exponential filter, the optimal discrete time constant of which can easily be adjusted in correspondence with a current time-discrete input signal supplied to the input of the filter.

According to the invention, a method for adjusting an adaptive exponential filter is provided, the input to which is supplied with a series of time-discrete input signals containing both data and noise and wherein an estimate of the standard deviation of the filter input signal has been determined prior to the execution of the adaptive exponential filter method, which method comprises the steps of measuring the deviation between the current input signal to the adaptive exponential filter and the prior sample period's output signal from the exponential filter, determining the proportion of said deviation to said estimate of the standard deviation, and adjusting the discrete time constant of the filter in response to said proportion to provide a filtered output signal at the output of the adaptive exponential filter.

The adaptive exponential filter according to the invention, wherein an estimate of the standard deviation of the filter input signal has been determined before, comprises a means for measuring the deviation between the current input signal to the adaptive exponential filter and the prior sample period's output signal from the exponential filter, a means for determining the proportion of said deviation to said estimate of the standard deviation, and a means for adjusting the discrete time constant of the filter in response to said proportion to provide a filtered output signal at the output of the adaptive exponential filter.

The above and further objects and advantages of the invention may be understood better by referring to the following detailed description, which should be read in conjunction with the accompanying drawings.

DESCRIPTION OF THE PREFERRED EMBODIMENT

Figure 1:
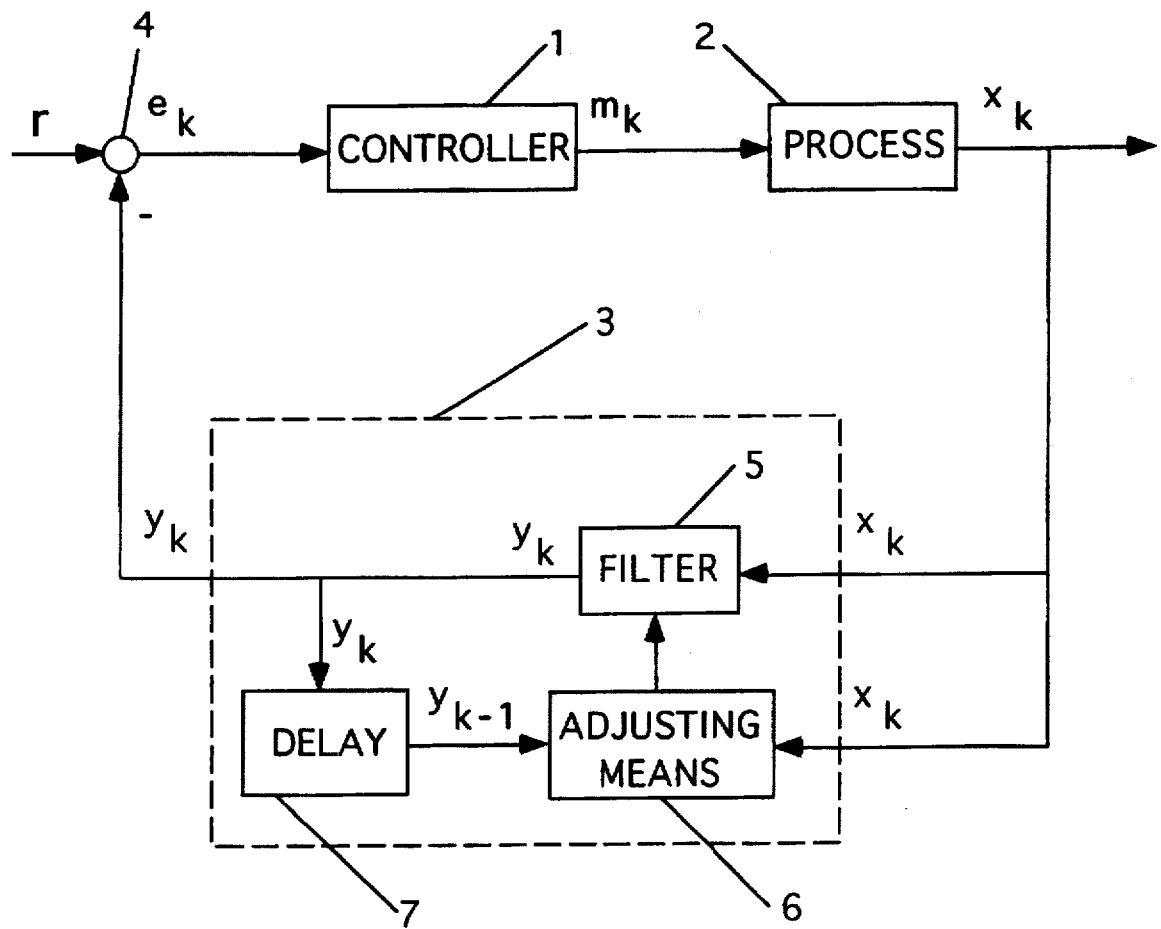
FIG. 1 shows, in a simplified block diagram form, a control loop with an adaptive digital filter according to the present invention.

FIG. 1 shows, in a simplified block diagram form, a control loop comprising a controller 1, a controlled system or process 2, and an adaptive filter 3.

A reference input signal r is supplied to a combining circuit 4 which can be either an adder where one of the inputs has been negated or a subtractor. In FIG. 1, the output from the adaptive filter 3 is negated and supplied to the combining circuit 4. The output from the combining circuit 4 is supplied as error signal $e_k$ (with k being a time index) to the controller 1 which produces a manipulated input $m_k$ to the process 2 as an output from the controller 1.

The process 2 can be any mechanical or chemical process such as a reactor, a container to be filled, a thyristor, a motor, or the like.

The filter input signal $x_k$ (which is also the digitized discrete process output signal representing the measurement of some variable in process 2 at current sampling periods), which can be any process variable such as temperature, flow, voltage, current, r.p.m., or the like, is supplied to the adaptive filter 3 comprising an exponential filter 5, an adjusting means 6, and a delay means 7. The filter output signal $y_k$ from the exponential filter 5 is supplied to the combining circuit 4.

The filter input signal $x_k$ which is output from the process 2 is sampled with a sample interval (or period) $T_S$ which can be one second or any other time depending on the steadiness of the process, the measuring devices, and other circumstances. This sampled filter input signal $x_k$, with k being the time index of the discrete time, is supplied as a series of time-discrete input signals to the exponential filter 5 and the adjusting means 6 of the adaptive filter 3.

The filter output signal $y_k$ (at the discrete time associated with the value of time index k, i.e. the current sampling period) of the exponential filter 5 is also supplied to the delay means 7 which delays the filter output signal $y_k$ (of the current sampling period) by one sampling period to create the delayed filter output signal from the prior sampling period $y_{k-1}$ which will be used in the calculation which will be executed in the next sampling period associated with the value of the next time index k+1. This means that, in the current sampling period having a time index k when the exponential filter 5 outputs the filter output signal $y_k$, the delayed filter output signal from the prior sampling period $y_{k-1}$, which was computed by the exponential filter 5 during the prior sampling period having prior time index k−1, is supplied from the delay means 7 to the adjusting means 6.

Figure 2:
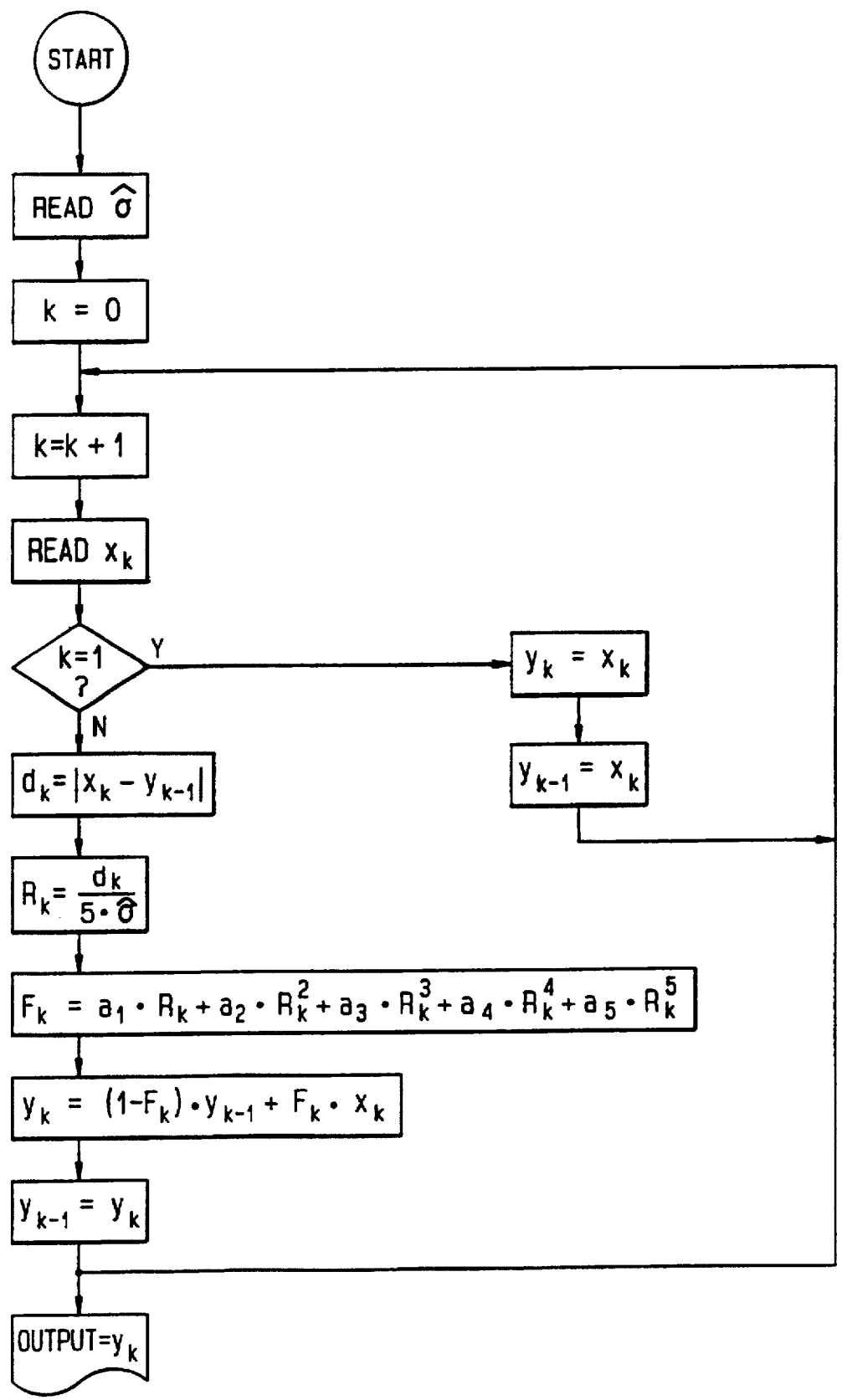
FIG. 2 is a flow chart showing the steps of the method for adjusting an adaptive digital filter according to the present invention.

Now, the operation of the adaptive filter 3 is described by referring to FIG. 2 showing in a functional diagram (flow chart) the operation of the adaptive filter 3.

An estimate of the standard deviation $\hat{\sigma}$ of the filter input signal $x_k$ has been determined prior to the execution of the adaptive exponential filter method according to any known method. In some applications of the invention, the best mode might be achieved if the estimate of the standard deviation $\hat{\sigma}$ is recomputed either on a periodic basis or upon transition of the operational status of the controlled process 2 (i.e., a shift in process control status from "adding component A" to "adding component B" where component B possesses a number of characteristics which are inherently different from component A).

The operation begins with an initialization part. The estimate of the standard deviation $\hat{\sigma}$ is read. Then the time index k is set to 0, and the first filter input signal $x_k$ is read, and the first filter output signal $y_k$ of the filter is set equal to $x_k$. Similarly, the delayed filter output signal from the prior sampling period $y_{k-1}$ of the filter is also set equal to the filter input signal $x_k$. Then the value of the time index k is increased by one and the filter input signal $x_k$ for the new sampling period is read.

Then the deviation $d_k$ of the filter input signal $x_k$ from the delayed filter output signal from the prior sampling period $y_{k-1}$ of the filter is calculated. This deviation $d_k$ is defined as $$d_k = |x_k - y_{k-1}| \qquad (3)$$

According to a rule of thumb, the proportion $R_k$ of the deviation $d_k$ to the estimate of the standard deviation $\hat{\sigma}$ is determined by $$R_k = \frac{d_k}{5 \cdot \hat{\sigma}} \qquad (4)$$

One approach for determination of the discrete filter time constant $F_k$ could be by the following formula:

$$F_k = a_1 R_k + a_2 R_k^2 + a_3 R_k^3 + a_4 R_k^4 + a_5 R_k^5 \qquad (5)$$

Figure 3:
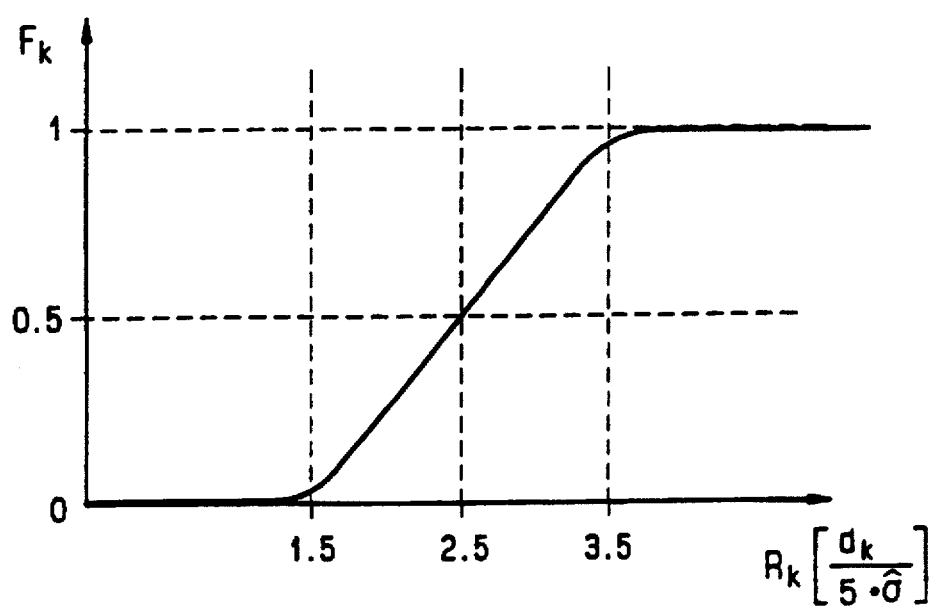
FIG. 3 is an illustration of an exemplary functional relationship between the discrete filter time constant and the proportion of the deviation of the current input signal from the output signal of the filter to the estimate of the standard deviation of the filter input signal.

In this formula, the factors $a_1$ to $a_5$ are determined by polynomial interpolation to approximate the functional relationship according to FIG. 3. When using the computer system of the applicant, the values could e.g. be (in a preferred embodiment of the invention):

$a_1=0.697; a_2=-7.705; a_3=32.66; a_4=-40.38; a_5=15.73.$

With the above determined discrete filter time constant $F_k$, the filter output signal $y_k$ could be determined according to the above-mentioned formula $$Y_k=(1-F_k)\cdot y_{k-1}+F_k\cdot x_k$$

Thereafter, the filter output signal $y_k$ is supplied to the combining circuit 4 and, as well, to the delay means 7. Then the value of the time index k is increased by one and the next filter input signal $x_k$ is read and so on.

FIG. 3 shows an illustration of an exemplary functional relationship between the discrete filter time constant $F_k$ and the proportion $R_k$ where the values of $R_k$ and $F_k$ are respectively determined according to the above formulas (4) and (5).

In this exemplary functional relationship, the discrete filter time constant $F_k$ is set to zero when the deviation $d_k$ is less than 1.5 times the estimate of the standard deviation, and is set to 1 when the deviation $d_k$ is greater than 3.5 times the estimate of the standard deviation.

This means that, in case of a deviation $d_k$ of less than 1.5 times the estimate of the standard deviation, the filter assumes that the change of process data is not significant, i.e. the change of the measured value is due to pure process noise only and the process itself is steady, so that the filter output signal $y_k$ of the filter is kept at the same value as it was in the prior sampling period.

In case of a deviation $d_k$ of more than 3.5 times the estimate of the standard deviation $\hat{\sigma}$, the filter assumes that a significant change of the process has taken place so that the filter input signat $x_k$ is effectively output by exponential filter 5 in such a manner as to set filter output signal $y_k=x_k$ without any apparent "filtering" modification.

In between these two extremes, the functional relationship between $F_k$ and $R_k$ does not have any discontinuities, as shown in FIG. 3. This means that the discrete filter time constant $F_k$ increases steadily from the value zero to the value 1 in response to the increase of the proportion $R_k$. This way of adjusting the adaptive exponential filter 3 is especially advantageous if the controller 1 incorporates a D-controller function (with derivative action).

The above-mentioned lower and upper predetermined values, in FIG. 3 depicted as 1.5 and 3.5, can also be determined in other ways, e.g. with 1 as lower and 4 as upper predetermined values. In a preferred embodiment of the invention the functional relationship is symmetrical.

In case the controller 1 comprises no D-controller the functional relationship can have two discontinuities at the above-mentioned lower and upper predetermined values. In this case, the curve can be combined out of three pieces, where $F_k=0$ if $R_k$ is less than the lower predetermined value; $F_k=1$ if $R_k$ is greater than the upper predetermined value; and the lower and upper predetermined values are connected by a straight line.

What is claimed is:

1. A method for adjusting an adaptive exponential filter, especially for noise reduction, the input to which is supplied with a series of time-discrete input signals containing both data and noise, wherein an estimate of the standard deviation of the filter input signal has been determined prior to the execution of the adaptive exponential filter method, comprising the steps of: measuring the deviation between a current filter input signal to the adaptive exponential filter and the prior sample period's output signal from the exponential filter, determining the proportion of said deviation to said estimate of the standard deviation, and adjusting the discrete time constant of the filter in response to said proportion to provide a filter output signal at the output of the adaptive exponential filter.

2. The method as defined in claim 1, wherein the discrete time constant of the filter is set equal to the value zero if said proportion is less than a first predetermined value.

3. The method as defined in claim 2, wherein the discrete time constant of the filter is set equal to the value 1 if said proportion is higher than a second predetermined value.

4. The method as defined in claim 3, wherein the discrete time constant of the filter increases steadily from the value zero to the value 1 in response to the increase of said proportion.

5. The method as defined in claim 3, wherein the functional relationship between the discrete filter time constant and said proportion has two discontinuities at said first and second predetermined values.

6. The method as defined in claim 1, wherein the functional relationship between the discrete filter time constant and said proportion has an S-shaped form.

7. The method as defined in claim 6, wherein the functional relationship is defined by $$F_k=a_1R_k+a_2R_k^2+a_3R_k^3+a_4R_k^4+a_5R_k^5$$

with $$R_k=\frac{d_k}{5\cdot\sigma}$$

and $$d_k=|x_k-y_{k-1}|$$

where $x_k$ is the filter input signal and $y_{k-1}$ the delayed filter output signal from the prior sampling period, $\hat{\sigma}$ the estimate of the standard deviation and $a_1$ to $a_5$ are determined by polynomial interpolation.

8. A method for controlling a control loop comprising a controller and a controlled system wherein the controlled output signals of the controlled system are fed back to the controller through a filter which is adjusted according to the method as defined in claim 1.

9. An adaptive exponential filter, especially for noise reduction, the input to which is supplied with a series of time-discrete input signals containing both data and noise and wherein an estimate of the standard deviation of the filter input signal has been determined prior to the execution of the adaptive exponential filter, comprising: a means for measuring the deviation between a current filter input signal to the adaptive exponential filter and the prior sample period's output signal from the exponential filter, a means for determining the proportion of said deviation to said estimate of the standard deviation, and a means for adjusting the discrete time constant of the filter in response to said proportion to provide a filter output signal at the output of the adaptive exponential filter.

10. The filter as defined in claim 9, wherein the discrete time constant of the filter is set equal to the value zero if said proportion is less than a first predetermined value.

11. The filter as defined in claim 10, wherein the discrete time constant of the filter is set equal to the value 1 if said proportion is higher than a second predetermined value.

12. The filter as defined in claim 11, wherein the means for adjusting the discrete time constant of the filter is capable of increasing steadily the discrete time constant of the filter from the value zero to the value 1 in response to the increase of said proportion above the first predetermined value.

13. The filter as defined in claim 11, wherein the functional relationship between the discrete filter time constant and said proportion has two discontinuities at said first and second predetermined values.

14. The filter as defined in claim 9, wherein the functional relationship between the discrete filter time constant and said proportion has an S-shaped form.

15. The filter as defined in claim 14, wherein the functional relationship is defined by $$F_k = a_1 R_k + a_2 R_k^2 + a_3 R_k^3 + a_4 R_k^4 + a_5 R_k^5$$

with $$R_k = \frac{d_k}{5 \cdot \hat{\sigma}}$$

and $$d_k = |x_k - y_{k-1}|$$

where $x_k$ is the filter input signal and $y_{k-1}$ the delayed filter output signal from the prior sampling period, $\hat{\sigma}$ the estimate of the standard deviation and $a_1$ to $a_5$ are determined by polynomial interpolation.

16. The adaptive exponential filter as defined in claim 9 being in a control loop comprising a controller and a controlled system, wherein a series of controlled outputs signals of the controlled system is supplied as the series of time-discrete filter input signals and the filter output signal is fed back to the controller.

17. A control loop comprising a controller and a controlled system wherein the output signals of the controlled system are fed back to the controller through a filter as defined in claim 9.

* * * * *